(12) United States Patent
Yosui et al.

(10) Patent No.: US 9,019,048 B1
(45) Date of Patent: Apr. 28, 2015

(54) HIGH-FREQUENCY SIGNAL TRANSMISSION LINE AND ELECTRONIC DEVICE

(71) Applicant: Murata Manufacturing Co., Ltd., Nagaokakyo-shi, Kyoto-fu (JP)

(72) Inventors: Kuniaki Yosui, Nagaokakyo (JP); Yuki Wakabayashi, Nagaokakyo (JP); Bunta Okamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/587,097

(22) Filed: Dec. 31, 2014

Related U.S. Application Data

(63) Continuation of application No. PCT/JP2014/052739, filed on Feb. 6, 2014.

(30) Foreign Application Priority Data

Feb. 13, 2013 (JP) ................................. 2013-025637
Jul. 26, 2013 (JP) ................................. 2013-155453

(51) Int. Cl.
*H03H 7/38* (2006.01)
*H01P 3/08* (2006.01)

(52) U.S. Cl.
CPC ... *H01P 3/08* (2013.01); *H03H 7/38* (2013.01)

(58) Field of Classification Search
CPC ............... H01P 3/08; H01P 3/06; H01P 3/04; H03H 7/38
USPC ........................... 333/33, 34, 238, 246, 1, 4, 5
See application file for complete search history.

(56) References Cited

U.S. PATENT DOCUMENTS

2012/0274423 A1    11/2012    Kato

FOREIGN PATENT DOCUMENTS

| JP | 2005-191902 A | 7/2005 |
| JP | 2007-123740 A | 5/2007 |
| JP | 2014-060042 A | 4/2014 |
| JP | 5527493 B1 | 6/2014 |
| WO | 2012/073591 A1 | 6/2012 |
| WO | 2014/003089 A1 | 1/2014 |
| WO | 2014/024744 A1 | 2/2014 |

OTHER PUBLICATIONS

Official Communication issued in International Patent Application No. PCT/JP2014/052739, mailed on Apr. 28, 2014.

*Primary Examiner* — Stephen E Jones
(74) *Attorney, Agent, or Firm* — Keating & Bennett, LLP

(57) ABSTRACT

A high-frequency signal transmission line includes a plate-shaped dielectric element assembly, a linear signal line, and a first ground conductor. The linear signal line is provided at the dielectric element assembly and includes a plurality of thick portions and a plurality of thin portions with a smaller width than the thick portions. The first ground conductor is provided at the dielectric element assembly and positioned on one side in a normal direction to the dielectric element assembly relative to the signal line. The first ground conductor includes a plurality of openings overlapping with the signal line and also includes bridge portions provided between the openings so as to cross the thin portions. The bridge portions cross the thin portion obliquely when viewed in a plan view in the normal direction to the dielectric element assembly.

18 Claims, 13 Drawing Sheets

HIGH-FREQUENCY SIGNAL TRANSMISSION LINE AND ELECTRONIC DEVICE

This application is based on Japanese Patent Application No. 2013-155453 filed on Jul. 26, 2013, Japanese Patent Application No. 2013-25637 filed on Feb. 13, 2013, and International Application No. PCT/JP2014/52739 filed on Feb. 6, 2014, the entire contents of each of which are incorporated herein by reference.

BACKGROUND OF THE INVENTION

1. Field of the Invention

The present invention relates to high-frequency signal transmission lines and electronic devices, more particularly to a high-frequency signal transmission line preferably for use in high-frequency signal transmission and an electronic device including the same.

2. Description of the Related Art

As an invention relevant to a conventional high-frequency signal transmission line, a high-frequency signal line described in, for example, International Patent Publication WO2012/073591 (see FIG. 12) is known.

The high-frequency signal line described in International Patent Publication WO2012/073591 includes a dielectric element assembly, a signal line, and first and second ground conductors. The dielectric element assembly is formed by laminating a plurality of dielectric sheets. The signal line is provided in the dielectric element assembly. The first and second ground conductors are provided in the dielectric element assembly so as to sandwich the signal line in the direction of lamination. As a result, the signal line and the first and second ground conductors form a stripline structure.

Furthermore, in the high-frequency signal line described in International Patent Publication WO2012/073591, the second ground conductor has a plurality of openings arranged along the signal line. That is, the second ground conductor has a ladder-shaped configuration. Accordingly, little capacitance is created between the signal line and the second ground conductor with the openings, and therefore, it is possible to position the second ground conductor and the signal line close to each other without excessively increasing the capacitance generated between the second ground conductor and the signal line. Thus, the high-frequency signal line described in International Patent Publication WO2012/073591 can be reduced in thickness without causing the characteristic impedance of the signal line to change significantly from a predetermined impedance value.

Incidentally, in the high-frequency signal line described in International Patent Publication WO2012/073591, for the reasons as will be described below, the second ground conductor has bridge portions provided between adjacent openings so as to cross the signal line. The high-frequency signal line is electrically connected at opposite ends to circuit boards by, for example, solder or connectors. Accordingly, the characteristic impedance of the signal line is likely to vary at opposite ends compared to other portions of the signal line. Therefore, high-frequency signal reflection occurs between the opposite ends of the signal line, so that noise with a half wavelength that is equal to the length of the signal line occurs. The frequency of noise with such a long wavelength tends to overlap with the effective bandwidth of an electronic device in which the high-frequency signal line is used.

Therefore, the high-frequency signal line described in International Patent Publication WO2012/073591 has the bridge portions overlapping with the signal line. The characteristic impedance of the signal line is lower in the areas where the signal line overlaps with the bridge portions than in the areas where the signal line does not overlap with the bridge portions. Accordingly, high-frequency signal reflection occurs at the overlapping portions of the signal line and the bridge portions, so that noise with a half wavelength that is equal to the distance between two adjacent bridge portions occurs. The frequency of noise including such a short wavelength is less likely to overlap with the effective frequency of an electronic device in which the high-frequency signal line is used.

However, in the high-frequency signal line described in International Patent Publication WO2012/073591, high-frequency signal reflection occurs at the overlapping portions of the signal line and the bridge portions, resulting in increased insertion loss in the high-frequency signal line.

Therefore, in the high-frequency signal line described in International Patent Publication WO2012/073591, the width of the signal line is narrower in the areas where the signal line overlaps with the bridge portions than in the areas where the signal line does not overlap with the bridge portions. This reduces the capacitance generated between the signal line and the bridge portions, so that the characteristic impedance of the signal line is prevented from becoming excessively low at the overlapping portions of the signal line and the bridge portions. That is, high-frequency signal reflection at the overlapping portions of the signal line and the bridge portions is reduced.

However, in the high-frequency signal line described in International Patent Publication WO2012/073591, since the width of the signal line narrows at the overlapping portions with the bridge portions, the resistance of the signal line becomes high at such overlapping portions. As a result, insertion loss in the high-frequency signal line increases.

SUMMARY OF THE INVENTION

A preferred embodiment of the present invention is directed to a high-frequency signal transmission line including a plate-shaped dielectric element assembly, a linear signal line provided at the dielectric element assembly and including a plurality of thick portions and a plurality of thin portions with a smaller width than the thick portions, and a first ground conductor provided at the dielectric element assembly and positioned on one side in a normal direction to the dielectric element assembly relative to the signal line, the first ground conductor including a plurality of openings overlapping with the signal line and also including bridge portions provided between the openings so as to cross the thin portions. The bridge portion crosses the thin portion obliquely when viewed in a plan view in the normal direction to the dielectric element assembly.

Another preferred embodiment of the present invention is directed to an electronic device including a high-frequency signal transmission line and a housing accommodating the high-frequency signal transmission line. The high-frequency signal transmission line includes a plate-shaped dielectric element assembly, a linear signal line provided at the dielectric element assembly and including a plurality of thick portions and a plurality of thin portions with a smaller width than the thick portions, and a first ground conductor provided at the dielectric element assembly and positioned on one side in a normal direction to the dielectric element assembly relative to the signal line, the first ground conductor including a plurality of openings arranged so as to overlap with the signal line and also including bridge portions provided between the openings so as to cross the thin portions. The bridge portion crosses the thin portion obliquely when viewed in a plan view in the normal direction to the dielectric element assembly.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, high-frequency signal transmission lines according to preferred embodiments of the present invention, along with an electronic device including the same, will be described with reference to the drawings.

Figure 1:
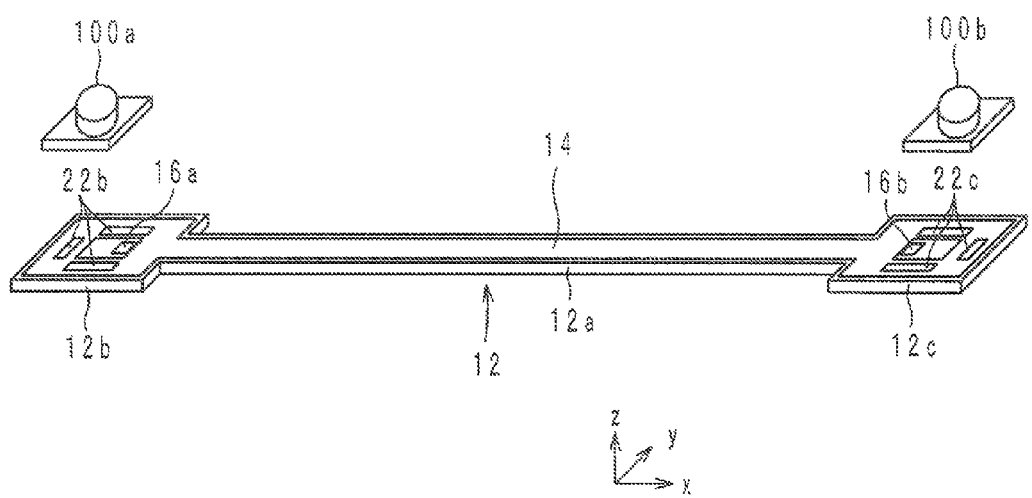
FIG. 1 is an external oblique view of a high-frequency signal transmission line according to a preferred embodiment of the present invention.
Figure 2:
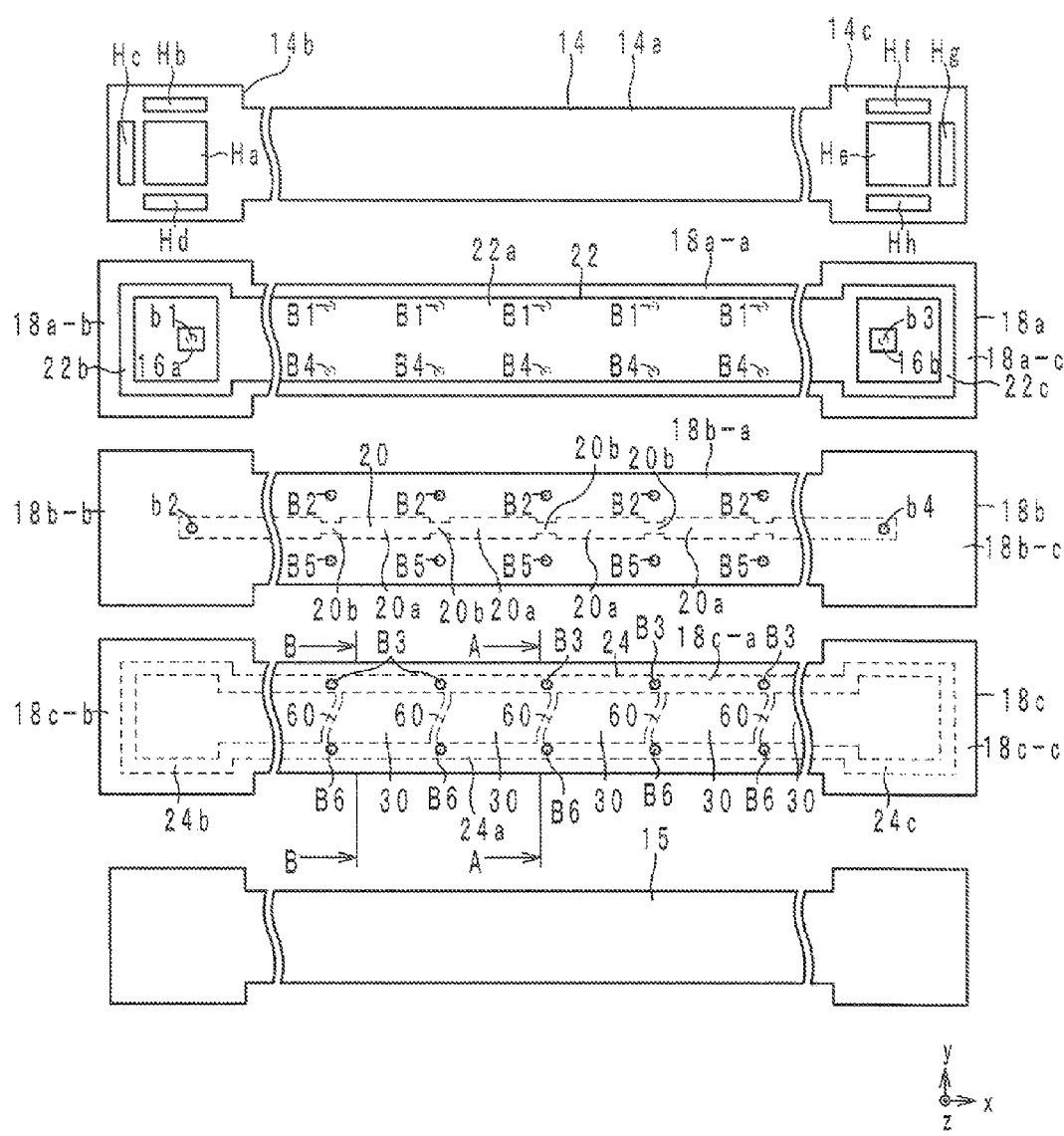
FIG. 2 is an exploded view of a dielectric element assembly of the high-frequency signal transmission line in FIG. 1.
Figure 3:
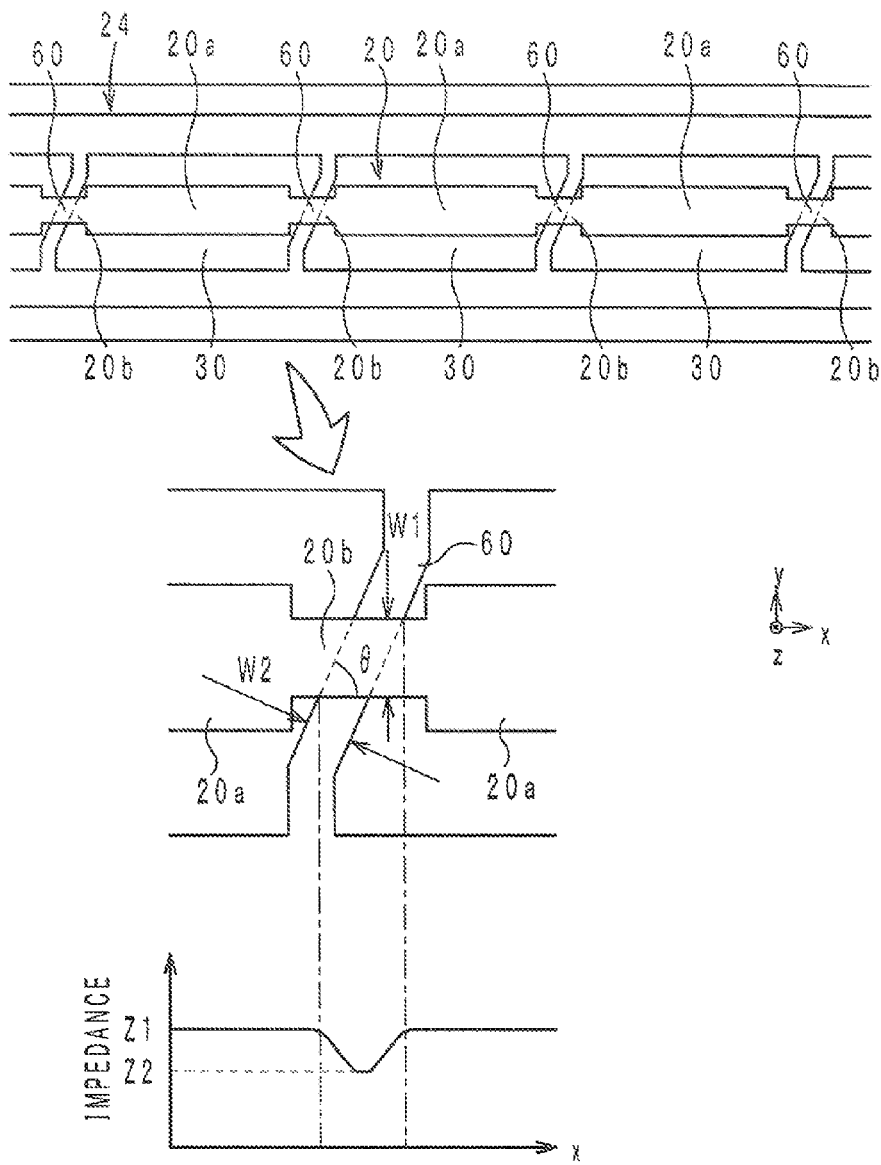
FIG. 3 provides a diagram illustrating the high-frequency signal transmission line with a signal line and an auxiliary ground conductor overlapping with each other, and also provides a graph showing a change in characteristic impedance of the signal line.
Figure 4:
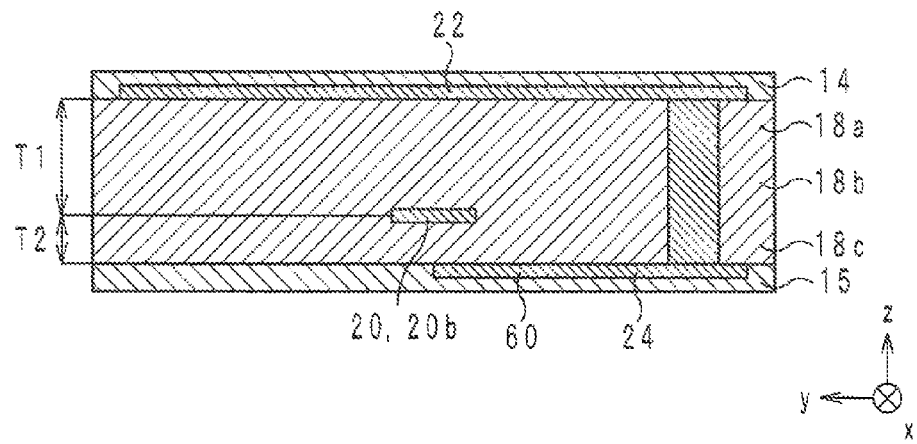
FIG. 4 is a cross-sectional structure view of the high-frequency signal transmission line taken along line A-A of FIG. 2.
Figure 5:
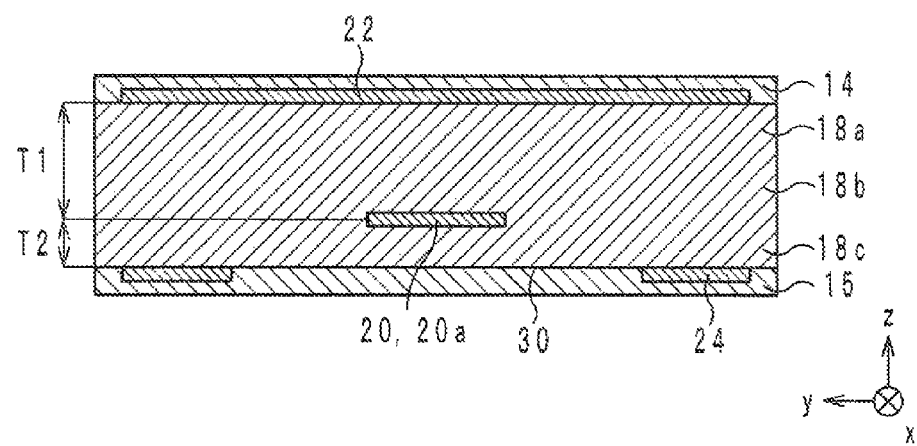
FIG. 5 is a cross-sectional structure view of the high-frequency signal transmission line taken along line B-B of FIG. 2.

The configurations of the high-frequency signal transmission line according to preferred embodiments will be described below with reference to the drawings. FIG. 1 is an external oblique view of the high-frequency signal transmission line 10 according to a preferred embodiment of the present invention. FIG. 2 is an exploded view of a dielectric element assembly 12 of the high-frequency signal transmission line 10 in FIG. 1. FIG. 3 provides a diagram illustrating the high-frequency signal transmission line 10 with a signal line 20 and an auxiliary ground conductor 24 overlapping with each other, and also provides a graph showing a change in characteristic impedance of the signal line 20. In the graph, the vertical axis represents the characteristic impedance, and the horizontal axis (x-axis) corresponds to the longitudinal direction of the high-frequency signal transmission line 10. FIG. 4 is a cross-sectional structure view of the high-frequency signal transmission line 10 taken along line A-A of FIG. 2. FIG. 5 is a cross-sectional structure view of the high-frequency signal transmission line 10 taken along line B-B of FIG. 2. In the following, the direction of lamination of the high-frequency signal transmission line 10 (a normal direction to the dielectric element assembly 12) will be defined as a z-axis direction. In addition, the longitudinal direction of the high-frequency signal transmission line 10 will be defined as an x-axis direction, and the direction perpendicular to the x-axis and z-axis directions will be defined as a y-axis direction.

The high-frequency signal transmission line 10 is preferably used in an electronic device such as a cell phone, in order to connect two high-frequency circuits, for example. The high-frequency signal transmission line 10 includes the dielectric element assembly 12, external terminals 16a and 16b, the signal line 20, a reference ground conductor 22, the auxiliary ground conductor 24, via-hole conductors b1 to b4 and B1 to B6, and connectors 100a and 100b, as shown in FIGS. 1 and 2.

The dielectric element assembly 12 is a flexible plate-shaped member extending in the x-axis direction when viewed in a plan view in the z-axis direction, as shown in FIG. 1, and includes a line portion 12a and connecting portions 12b and 12c. The dielectric element assembly 12 is a laminate preferably formed by laminating a protective layer 14, dielectric sheets 18a to 18c, and a protective layer 15 in this order, from the positive side to the negative side in the z-axis direction, as shown in FIG. 2. In the following, the principal surface of the dielectric element assembly 12 that is located on the positive side in the z-axis direction will be referred to as a top surface, and the principal surface of the dielectric element assembly 12 that is located on the negative side in the z-axis direction will be referred to as a bottom surface.

The line portion 12a is preferably in the form of a strip extending in the x-axis direction, as shown in FIG. 1. The connecting portions 12b and 12c are preferably in the form of rectangles connected to the ends of the line portion 12a on the negative and positive sides, respectively, in the x-axis direction. Each of the connecting portions 12b and 12c is wider than the line portion 12a in the y-axis direction.

The dielectric sheets 18a to 18c, when viewed in a plan view in the z-axis direction, extend in the x-axis direction and have the same shape as the dielectric element assembly 12, as shown in FIG. 2. The dielectric sheets 18a to 18c are preferably made of a flexible thermoplastic resin such as polyimide or liquid crystal polymer. Each of the dielectric sheets 18a to 18c preferably has a thickness of, for example, about 20 µm to about 300 µm, in the present preferred embodiment, about 100 µm.

Furthermore, the dielectric sheet 18a includes a line portion 18a-a and connecting portions 18a-b and 18a-c. The dielectric sheet 18b includes a line portion 18b-a and connecting portions 18b-b and 18b-c. The dielectric sheet 18c includes a line portion 18c-a and connecting portions 18c-b and 18c-c. The line portions 18a-a, 18b-a, and 18c-a constitute the line portion 12a. The connecting portions 18a-b, 18b-b, and 18c-b constitute the connecting portion 12b. The connecting portions 18a-c, 18b-c, and 18c-c constitute the connecting portion 12c.

The signal line 20 preferably is a linear conductor provided for high-frequency signal transmission in the direction in which the dielectric element assembly 12 extends, as shown in FIG. 2. In the present preferred embodiment, the signal line 20 is provided on the bottom surface of the dielectric sheet 18b. The signal line 20 extends along the line portion 18b-a in the x-axis direction. The end of the signal line 20 that is located on the negative side in the x-axis direction is positioned at or approximately at the center of the connecting portion 18b-b. The end of the signal line 20 that is located on the positive side in the x-axis direction is positioned at or approximately at the center of the connecting portion 18b-c.

Furthermore, the signal line 20 includes a plurality of thick portions 20a and a plurality of thin portions 20b. The thin portion 20b has a smaller width than the thick portion 20a. The thick portions 20a and the thin portions 20b alternate with each other. The width of the thick portion 20a preferably is, for example, from about 300 µm to about 700 µm. In the present preferred embodiment, the thick portion 20a preferably is about 300-µm wide, for example. The width of the thin portion 20b preferably is, for example, from about 30 µm to about 200 µm. In the present preferred embodiment, the thin portion 20b preferably is about 100-µm wide, for example.

The signal line 20 is made of a metal material including silver or copper and having a low specific resistance. Here, the signal line 20 is formed on the bottom surface of the dielectric sheet 18b preferably by patterning metal foil formed by plating the bottom surface of the dielectric sheet 18b or preferably by patterning metal foil attached to the bottom surface of the dielectric sheet 18b. Moreover, the top surface of the signal line 20 is smoothened, so that surface roughness of the signal line 20 is greater on the side that contacts the dielectric sheet 18b than on the side that does not contact the dielectric sheet 18b.

The reference ground conductor 22 is provided on the positive side in the z-axis direction relative to the signal line 20. More specifically, the reference ground conductor 22 is arranged on the top surface of the dielectric sheet 18a so as to be opposite to the signal line 20 with the dielectric sheets 18a and 18b positioned therebetween. The characteristic impedance of the high-frequency signal transmission line 10 is mainly determined by the opposing areas of the signal line 20 and the reference ground conductor 22 and the distance therebetween, as well as by the relative permittivities of the dielectric sheets 18a to 18c. Therefore, in the case where the characteristic impedance of the high-frequency signal transmission line 10 is to be set to about 50Ω, for example, the characteristic impedance of the high-frequency signal transmission line 10 is designed to become about 55Ω, for example, slightly higher than about 50Ω, because of the influence of the signal line 20 and the reference ground conductor 22. Moreover, the auxiliary ground conductor 24 is shaped as will be described later, such that the characteristic impedance of the high-frequency signal transmission line 10 becomes about 50Ω. because of the influence of the signal line 20, the reference ground conductor 22, and the auxiliary ground conductor 24.

The reference ground conductor 22 preferably is made of a metal material including silver or copper and including a low specific resistance. Here, the reference ground conductor 22 is formed on the top surface of the dielectric sheet 18a preferably by patterning metal foil formed by plating the top surface of the dielectric sheet 18a or preferably by patterning metal foil attached to the top surface of the dielectric sheet 18a. Moreover, the top surface of the reference ground conductor 22 is smoothened, so that surface roughness of the reference ground conductor 22 is greater on the side that contacts the dielectric sheet 18a than on the side that does not contact the dielectric sheet 18a.

Furthermore, the reference ground conductor 22 includes a main conductor 22a and terminal conductors 22b and 22c. The main conductor 22a is a strip-shaped conductor provided on the top surface of the line portion 18a-a and extending in the x-axis direction. The main conductor 22a is a solid conductor provided with no openings overlapping with the signal line 20. The terminal conductor 22b is preferably provided in the form of a rectangular or substantially rectangular frame on the top surface of the connecting portion 18a-b. The terminal conductor 22b is connected to the end of the main conductor 22a on the negative side in the x-axis direction. The terminal conductor 22c is preferably provided in the form of a rectangular or substantially rectangular frame on the top surface of the connecting portion 18a-c. The terminal conductor 22c is connected to the end of the main conductor 22a on the positive side in the x-axis direction.

The auxiliary ground conductor 24 is positioned on the negative side in the z-axis direction relative to the signal line 20. The auxiliary ground conductor 24 preferably includes a plurality of openings 30 arranged along the signal line 20. More specifically, the auxiliary ground conductor 24 is arranged on the bottom surface of the dielectric sheet 18c, so as to be opposite to the signal line 20 with the dielectric sheet 18c positioned therebetween. The auxiliary ground conductor 24 is a ground conductor that doubles as a shield.

The auxiliary ground conductor 24 is made of a metal material including silver or copper and including a low specific resistance. Here, the auxiliary ground conductor 24 is formed on the bottom surface of the dielectric sheet 18c preferably by patterning metal foil formed by plating the bottom surface of the dielectric sheet 18c or preferably by patterning metal foil attached to the bottom surface of the dielectric sheet 18c. Moreover, the top surface of the auxiliary ground conductor 24 is smoothened, so that surface roughness of the auxiliary ground conductor 24 is greater on the side that contacts the dielectric sheet 18c than on the side that does not contact the dielectric sheet 18c.

Furthermore, the auxiliary ground conductor 24 includes a main conductor 24a and terminal conductors 24b and 24c. The main conductor 24a is a strip-shaped conductor provided on the bottom surface of the line portion 18c-a and extending in the x-axis direction. The main conductor 24a preferably includes the openings 30 provided therein, as shown in FIG. 2. Accordingly, the main conductor 24a preferably has a ladder-shaped configuration. The openings 30 overlap with the thick portions 20a when viewed in a plan view in the z-axis direction, as shown in FIG. 3. In the present preferred embodiment, the thick portions 20a are positioned within the openings 30 when viewed in a plan view in the z-axis direction.

Furthermore, since the openings 30 are provided, the main conductor 24a preferably includes a plurality of bridge portions 60 between adjacent openings 30. The bridge portions 60 extend essentially in the y-axis direction so as to cross the thin portions 20b, when viewed in a plan view in the z-axis direction, as shown in FIG. 3. The bridge portions 60 are oblique toward the positive end in the x-axis direction when viewed from the center toward the positive end in the y-axis direction. Accordingly, the bridge portions 60 cross the thin portions 20b obliquely when viewed in a plan view in the z-axis direction. Note that the oblique crossing means that the bridge portion 60 is neither parallel nor perpendicular to the thin portion 20b, and makes an angle greater than 0° but less than 90° with respect to the thin portion 20b. Moreover, the bridge portion 60 extends straight in the y-axis direction at opposite ends.

In the main conductor 24a, the openings 30 and the bridge portions 60 overlap with the signal line 20 alternatingly when viewed in a plan view in the z-axis direction. Moreover, in the present preferred embodiment, the signal line 20 crosses the openings 30 and the bridge portions 60 in the x-axis direction so as to pass through their approximate centers in the y-axis direction.

The terminal conductor 24b is preferably provided in the form of a rectangular or substantially rectangular frame on the bottom surface of the connecting portion 18c-b. The terminal conductor 24b is connected to the end of the main conductor 24a on the negative side in the x-axis direction. The terminal conductor 24c is preferably provided in the form of a rectangular or substantially rectangular frame on the bottom surface of the connecting portion 18c-c. The terminal conductor 24c is connected to the end of the main conductor 24a on the positive side in the x-axis direction.

Furthermore, the auxiliary ground conductor 24 is designed for final adjustments to the characteristic impedance of the high-frequency signal transmission line 10 such that it becomes about 50Ω, as described earlier. In addition, the interval between the bridge portions 60 of the auxiliary ground conductor 24 is designed so as not to cause noise to be generated within the effective bandwidth. More specifically, the interval between adjacent bridge portions 60 is preferably designed to be shorter than a half of the wavelength of a frequency in the effective bandwidth for the high-frequency signal transmission line 10 and an electronic device using the high-frequency signal transmission line 10. As a result, the frequency of noise radiated from the signal line 20 does not overlap with the effective bandwidth for the high-frequency signal transmission line 10 and the electronic device using the high-frequency signal transmission line 10.

The external terminal 16a preferably is a rectangular or substantially rectangular conductor provided essentially at the center on the top surface of the connecting portion 18a-b, as shown in FIGS. 1 and 2. Accordingly, the external terminal 16a, when viewed in a plan view in the z-axis direction, overlaps with the end of the signal line 20 on the negative side in the x-axis direction. The external terminal 16b preferably is a rectangular or substantially rectangular conductor provided essentially at the center on the top surface of the connecting portion 18a-c, as shown in FIGS. 1 and 2. Accordingly, the external terminal 16b, when viewed in a plan view in the z-axis direction, overlaps with the end of the signal line 20 on the positive side in the x-axis direction.

The external terminals 16a and 16b are preferably made of a metal material including silver or copper and including a low specific resistance. In addition, the top surfaces of the external terminals 16a and 16b are preferably plated with Ni and Au. Here, the external terminals 16a and 16b are formed on the top surface of the dielectric sheet 18a preferably by patterning metal foil formed by plating the top surface of the dielectric sheet 18a or preferably by patterning metal foil attached to the top surface of the dielectric sheet 18a. Moreover, the top surfaces of the external terminals 16a and 16b are smoothened, so that surface roughness of the external terminals 16a and 16b is greater on the side that contacts the dielectric sheet 18a than on the side that does not contact the dielectric sheet 18a.

In this manner, the signal line 20 is positioned between the reference ground conductor 22 and the auxiliary ground conductor 24 in the z-axis direction. That is, the signal line 20, the reference ground conductor 22, and the auxiliary ground conductor 24 define a tri-plate stripline structure. However, the auxiliary ground conductor 24 has the openings 30 provided therein, and therefore, the area of the auxiliary ground conductor 24 that is opposite to the signal line 20 is smaller than the area of the reference ground conductor 22 that is opposite to the signal line 20, i.e., an overlap amount of the auxiliary ground conductor 24 and the signal line 20 is less than an overlap amount of the reference ground conductor 22 and the signal line 20.

Moreover, the distance T1 between the signal line 20 and the reference ground conductor 22 preferably is, for example, from about 20 μm to about 300 μm, which is equal or approximately equal to the total of the thickness of the dielectric sheet 18a and the thickness of the dielectric sheet 18b, as shown in FIGS. 4 and 5. In the present preferred embodiment, the distance T1 between the signal line 20 and the reference ground conductor 22 preferably is about 100 μm, for example. On the other hand, the distance T2 between the signal line 20 and the auxiliary ground conductor 24 preferably is, for example, from about 10 μm to about 100 μm, which is equal or approximately equal to the thickness of the dielectric sheet 18c, as shown in FIGS. 4 and 5. In the present preferred embodiment, the distance T2 between the signal line 20 and the auxiliary ground conductor 24 preferably is about 50 μm, for example. That is, the distance T1 between the reference ground conductor 22 and the signal line 20 is designed to be greater than the distance T2 between the auxiliary ground conductor 24 and the signal line 20.

The via-hole conductor b1 pierces through the connecting portion 18a-b of the dielectric sheet 18a in the z-axis direction.

The via-hole conductor b2 pierces through the connecting portion 18b-b of the dielectric sheet 18b in the z-axis direction. The via-hole conductors b1 and b2 are connected to each other to constitute a single via-hole conductor, thus connecting the external terminal 16a to the end of the signal line 20 that is located on the negative side in the x-axis direction. The via-hole conductor b3 pierces through the connecting portion 18a-c of the dielectric sheet 18a in the z-axis direction. The via-hole conductor b4 pierces through the connecting portion 18b-c of the dielectric sheet 18b in the z-axis direction. The via-hole conductors b3 and b4 are connected to each other to constitute a single via-hole conductor, thus connecting the external terminal 16b to the end of the signal line 20 that is located on the positive side in the x-axis direction. As a result, the signal line 20 is connected between the external terminals 16a and 16b. The via-hole conductors b1 to b4 are preferably formed by filling through-holes, which are provided in the dielectric sheets 18a and 18b, with a metal material.

The via-hole conductors B1 pierce through the line portion 18a-a of the dielectric sheet 18a in the z-axis direction. The via-hole conductors B1 are positioned on the positive side in the y-axis direction relative to the bridge portions 60 so as to be arranged in a line in the x-axis direction, as shown in FIG. 2. The via-hole conductors B2 pierce through the line portion 18b-a of the dielectric sheet 18b in the z-axis direction. The via-hole conductors B2 are positioned on the positive side in the y-axis direction relative to the bridge portions 60 so as to be arranged in a line in the x-axis direction, as shown in FIG. 2. The via-hole conductors B3 pierce through the line portion 18c-a of the dielectric sheet 18c in the z-axis direction. The via-hole conductors B3 are positioned on the positive side in the y-axis direction relative to the bridge portions 60 so as to be arranged in a line in the x-axis direction, as shown in FIG. 2. The via-hole conductors B1 to B3 are connected to one another such that each set constitutes a single via-hole conductor, thus connecting the reference ground conductor 22 and the auxiliary ground conductor 24. The via-hole conductors B1 to B3 are preferably formed by filling through-holes, which are provided in the dielectric sheets 18a to 18c, with a metal material.

The via-hole conductors B4 pierce through the line portion 18a-a of the dielectric sheet 18a in the z-axis direction. The via-hole conductors B4 are positioned on the negative side in the y-axis direction relative to the bridge portions 60 so as to be arranged in a line in the x-axis direction, as shown in FIG. 2. The via-hole conductors B5 pierce through the line portion 18b-a of the dielectric sheet 18b in the z-axis direction. The via-hole conductors B5 are positioned on the negative side in the y-axis direction relative to the bridge portions 60 so as to be arranged in a line in the x-axis direction, as shown in FIG. 2. The via-hole conductors B6 pierce through the line portion 18c-a of the dielectric sheet 18c in the z-axis direction. The via-hole conductors B6 are positioned on the negative side in the y-axis direction relative to the bridge portions 60 so as to be arranged in a line in the x-axis direction, as shown in FIG. 2. The via-hole conductors B4 to B6 are connected to one another such that each set constitutes a single via-hole conductor, thus connecting the reference ground conductor 22 and the auxiliary ground conductor 24. The via-hole conductors B4 to B6 are preferably formed by filling through-holes, which are provided in the dielectric sheets 18a to 18c, with a metal material.

The protective layer 14 is an insulating film covering approximately the entire top surface of the dielectric sheet 18a. Accordingly, the reference ground conductor 22 is covered by the protective layer 14. The protective layer 14 is made of, for example, a flexible resin such as a resist material.

Furthermore, the protective layer 14 includes a line portion 14a and connecting portions 14b and 14c, as shown in FIG. 2. The line portion 14a covers the entire top surface of the line portion 18a-a, thus covering the main conductor 22a.

The connecting portion 14b is connected to the end of the line portion 14a on the negative side in the x-axis direction, and covers the top surface of the connecting portion 18b. However, the connecting portion 14b including openings Ha to Hd provided therein. The opening Ha preferably is a rectangular or substantially rectangular opening provided at the center of the connecting portion 14b. The external terminal 16a is exposed to the outside from the opening Ha. The opening Hb preferably is a rectangular or substantially rectangular opening positioned on the positive side in the y-axis direction relative to the opening Ha. The opening Hc preferably is a rectangular or substantially rectangular opening positioned on the negative side in the x-axis direction relative to the opening Ha. The opening Hd preferably is a rectangular or substantially rectangular opening positioned on the negative side in the y-axis direction relative to the opening Ha. The terminal portion 22b is exposed to the outside from the openings Hb to Hd, so that the exposed portions serve as external terminals.

The connecting portion 14c is connected to the end of the line portion 14a on the positive side in the x-axis direction, and covers the top surface of the connecting portion 18a-c. However, the connecting portion 14c includes openings He to Hh provided therein. The opening He preferably is a rectangular or substantially rectangular opening provided at the center of the connecting portion 14c. The external terminal 16b is exposed to the outside from the opening He. The opening Hf preferably is a rectangular or substantially rectangular opening positioned on the positive side in the y-axis direction relative to the opening He. The opening Hg preferably is a rectangular or substantially rectangular opening positioned on the positive side in the x-axis direction relative to the opening He. The opening Hh preferably is a rectangular or substantially rectangular opening positioned on the negative side in the y-axis direction relative to the opening He. The terminal conductor 22c is exposed to the outside from the openings Hf to Hh, so that the exposed portions define and serve as external terminals.

The protective layer 15 is an insulating film covering approximately the entire bottom surface of the dielectric sheet 18c. Accordingly, the ground conductor 24 is covered by the protective layer 15. The protective layer 15 is made of, for example, a flexible resin such as a resist material.

In the high-frequency signal transmission line 10 thus configured, the characteristic impedance of the signal line 20 fluctuates cyclically between impedance values Z1 and Z2, as shown in the graph in FIG. 3. More specifically, at the overlapping portions of the signal line 20 and the openings 30, relatively low capacitance is generated between the signal line 20 and the reference ground conductor 22 and also between the signal line and the auxiliary ground conductor 24. Accordingly, the characteristic impedance of the signal line 20 is relatively high at the impedance value Z1 at the overlapping portions with the openings 30.

On the other hand, at the overlapping portions of the signal line 20 and the bridge portions 60, relatively high capacitance is generated between the signal line 20 and the reference ground conductor 22 and also between the signal line 20 and the auxiliary ground conductor 24. Accordingly, at the overlapping portions of the signal line 20 and the bridge portions 60, the characteristic impedance of the signal line 20 is relatively low at the impedance value Z2. Moreover, the openings 30 and the bridge portions 60 are arranged so as to alternate with each other in the x-axis direction. Accordingly, the characteristic impedance of the signal line 20 fluctuates cyclically between the impedance values Z1 and Z2. The impedance value Z1 preferably is, for example, about 55Ω, and the impedance value Z2 is, for example, about 45Ω. The average characteristic impedance of the entire signal line 20 preferably is, for example, about 50Ω.

Figure 6:
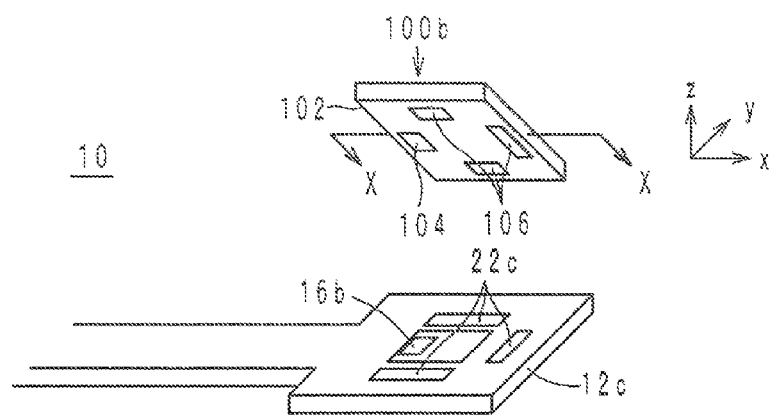
FIG. 6 is an external oblique view of a connector of the high-frequency signal transmission line.
Figure 7:
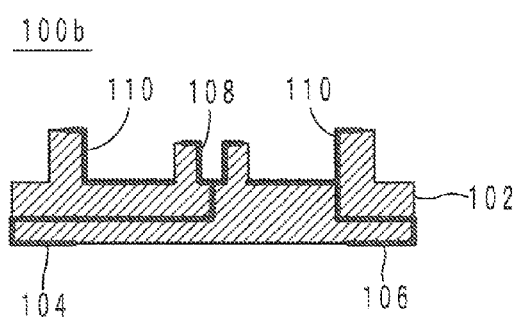
FIG. 7 is a cross-sectional structure view of the connector.

The connectors 100a and 100b are mounted on the top surfaces of the connecting portions 12b and 12c, respectively, as shown in FIG. 1. The connectors 100a and 100b preferably have the same configuration, and therefore, only the configuration of the connector 100b will be described below as an example. FIG. 6 is an external oblique view of the connector 100b of the high-frequency signal transmission line 10. FIG. 7 is a cross-sectional structure view of the connector 100b.

The connector 100b includes a connector body 102, external terminals 104 and 106, a center conductor 108, and an external conductor 110, as shown in FIGS. 1, 6, and 7. The connector body 102 preferably includes a rectangular or substantially rectangular plate and a cylindrical or substantially cylindrical portion coupled thereon, and is made of an insulating material such as resin.

The external terminal 104 is positioned on the plate of the connector body 102 on the negative side in the z-axis direction, so as to face the external terminal 16b. The external terminal 106 is positioned on the plate of the connector body 102 on the negative side in the z-axis direction, so as to correspond to the portions of the terminal portion 22c exposed from the openings Hf to Hh.

The center conductor 108 is positioned at the center of the cylindrical portion of the connector body 102, and is connected to the external terminal 104. The center conductor 108 is a signal terminal to/from which a high-frequency signal is inputted/outputted. The external conductor 110 is positioned on the inner circumferential surface of the cylindrical portion of the connector body 102, and is connected to the external terminal 106. The external conductor 110 is a ground terminal to be kept at a ground potential.

The connector 100b thus configured is mounted on the top surface of the connecting portion 12c, such that the external terminal 104 is connected to the external terminal 16b, and the external terminal 106 is connected to the terminal portion 22c, as shown in FIG. 6. As a result, the signal line 20 is electrically connected to the center conductor 108. In addition, the reference ground conductor 22 and the auxiliary ground conductor 24 are electrically connected to the external conductor 110.

Figure 8:
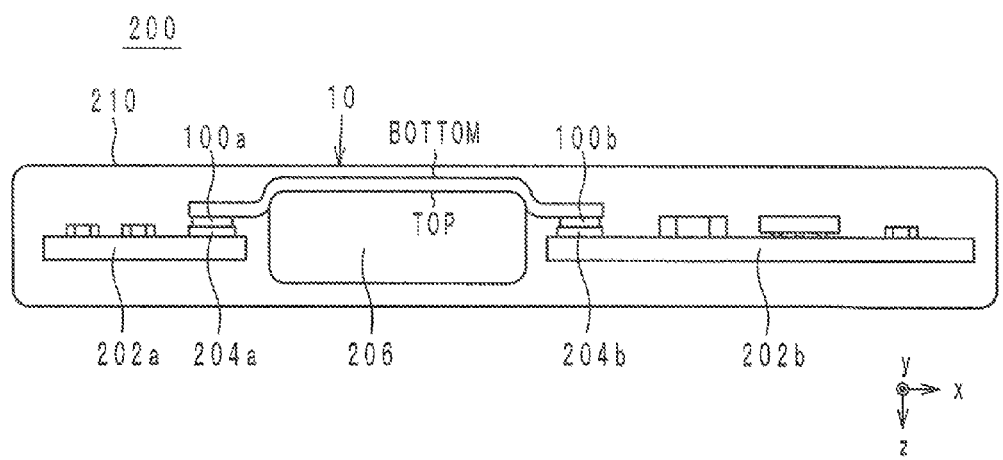
FIG. 8 illustrates an electronic device provided with a high-frequency signal transmission line as viewed in a plan view in the y-axis direction.
Figure 9:
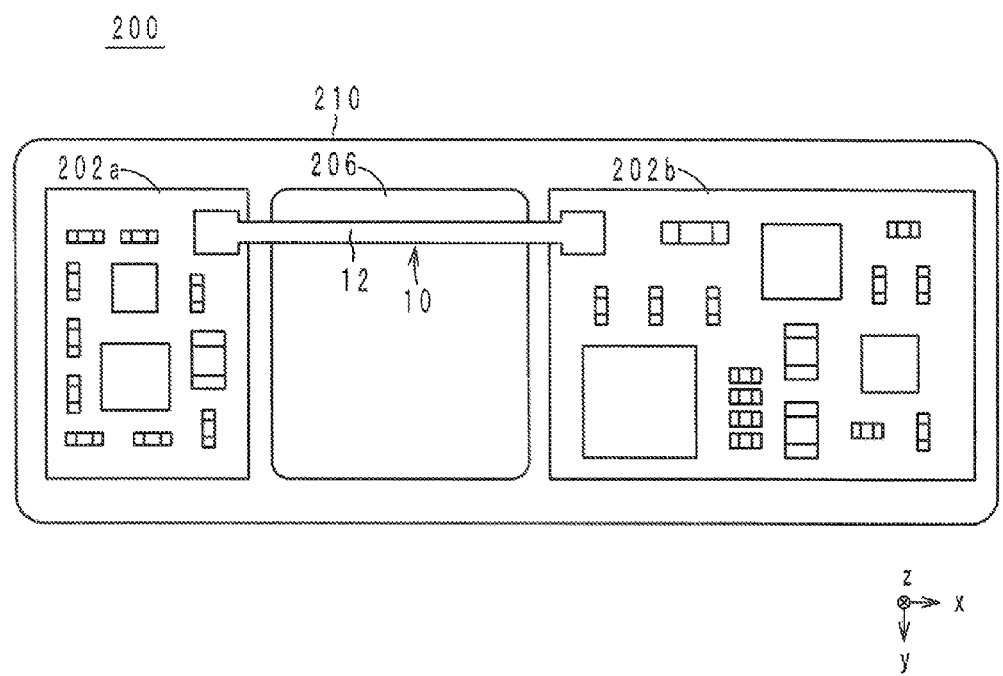
FIG. 9 illustrates the electronic device provided with the high-frequency signal transmission line as viewed in a plan view in the z-axis direction.

The high-frequency signal transmission line 10 is preferably used in a manner as will be described below. FIG. 8 illustrates an electronic device 200 provided with the high-frequency signal transmission line 10 as viewed in a plan view in the y-axis direction. FIG. 9 illustrates the electronic device 200 provided with the high-frequency signal transmission line 10 as viewed in a plan view in the z-axis direction.

The electronic device 200 includes the high-frequency signal transmission line 10, circuit boards 202a and 202b, receptacles 204a and 204b, a battery pack (metallic body) 206, and a housing 210.

The housing 210 accommodates the high-frequency signal transmission line 10, the circuit boards 202a and 202b, the receptacles 204a and 204b, and the battery pack 206. The circuit board 202a is provided with, for example, a transmission or reception circuit including an antenna. The circuit board 202b is provided with, for example, a feed circuit. The battery pack 206 is, for example, a lithium-ion secondary battery, and the surface thereof is wrapped by a metal cover. The circuit board 202a, the battery pack 206, and the circuit board 202b are arranged in this order, from the negative side to the positive side in the x-axis direction.

The receptacles 204a and 204b are provided on the principal surfaces of the circuit boards 202a and 202b, respectively, on the negative side in the z-axis direction. The receptacles 204a and 204b are connected to the connectors 100a and 100b, respectively. Accordingly, high-frequency signals to be transmitted between the circuit boards 202a and 202b at a frequency of, for example, 2 GHz are applied to the center conductors 108 of the connectors 100a and 100b via the receptacles 204a and 204b, respectively. Moreover, the external conductors 110 of the connectors 100a and 100b are kept at a ground potential by the circuit boards 202a and 202b and the receptacles 204a and 204b. Thus, the high-frequency signal transmission line 10 connects the circuit boards 202a and 202b.

Here, the top surface of the dielectric element assembly 12 (more precisely, the protective layer 14) is in contact with the battery pack 206. The dielectric element assembly 12 and the battery pack 206 are fixed preferably by an adhesive or the like. The top surface of the dielectric element assembly 12 is the principal surface that is located on the side of the reference ground conductor 22 relative to the signal line 20. Accordingly, the reference ground conductor 22, which is preferably in the form of a solid with no openings, is positioned between the signal line 20 and the battery pack 206.

A non-limiting example of a method for producing the high-frequency signal transmission line 10 will be described below with reference to the drawings. While the following description focuses on one high-frequency signal transmission line 10 as an example, in actuality, large-sized dielectric sheets are laminated and cut, so that a plurality of high-frequency signal transmission lines 10 are produced at the same time.

Prepared first are dielectric sheets 18a to 18c made of a thermoplastic resin, each sheet including one of its principal faces copper-foiled (i.e., coated with a metal film). More specifically, copper foil is attached to the top surfaces of the dielectric sheets 18a to 18c. In addition, the copper-foiled surfaces of the dielectric sheets 18a to 18c are smoothened, for example, by galvanization for rust prevention. The dielectric sheets 18a to 18c are sheets of liquid crystal polymer. The thickness of the copper foil is from about 10 μm to about 20 μm.

Next, external terminals 16a and 16b and a reference ground conductor 22, as shown in FIG. 2, are formed on the top surface of the dielectric sheet 18a preferably by patterning the copper foil on the top surface of the dielectric sheet 18a. More specifically, resists are printed on the copper foil of the dielectric sheet 18a in the same shapes as the external terminals 16a and 16b and the reference ground conductor 22 shown in FIG. 2. Then, any portions of the copper foil that are not coated with the resists are removed by etching the copper foil. Thereafter, the resists are removed by spraying a resist solvent. In this manner, the external terminals 16a and 16b and the reference ground conductor 22, as shown in FIG. 2, are formed on the top surface of the dielectric sheet 18a by photolithography.

Next, a signal line 20, as shown in FIG. 2, is formed on the bottom surface of the dielectric sheet 18b. In addition, a ground conductor 24, as shown in FIG. 2, is formed on the bottom surface of the dielectric sheet 18c. The steps of forming the signal line 20 and the auxiliary ground conductor 24 are the same as the steps of forming the external terminals 16a and 16b and the reference ground conductor 22, and therefore, any detailed descriptions thereof will be omitted.

Next, via-holes are bored through the dielectric sheets 18a to 18c by irradiating the dielectric sheets 18a to 18c with laser beams where via-hole conductors b1 to b4 and B1 to B6 are to be formed. Thereafter, the via-holes are filled with a conductive paste, thus forming the via-hole conductors b1 to b4 and B1 to B6.

Next, the dielectric sheets 18a to 18c are stacked in this order, from the positive side to the negative side in the z-axis direction, thus obtaining a dielectric element assembly 12. The dielectric element assembly 12 is heated and pressed from both the positive and negative sides in the z-axis direction. As a result, the dielectric sheets 18a to 18c are softened and fluidized. Thereafter, the dielectric sheets 18a to 18c solidify as the dielectric element assembly 12 cools down. Consequently, the dielectric sheets 18a to 18c are fused so that the dielectric element assembly 12 is completed.

Next, a resin (resist) paste is applied to the top surface of the dielectric sheet 18a by screen printing, thus forming a protective layer 14 on the top surface of the dielectric sheet 18a so as to cover the reference ground conductor 22. In addition, a resin (resist) paste is applied to the bottom surface of the dielectric sheet 18c by screen printing, thus forming a protective layer 15 on the bottom surface of the dielectric sheet 18c so as to cover the auxiliary ground conductor 24.

Lastly, the connectors 100a and 100b are mounted on the connecting portions 12b and 12c by soldering them to the external terminals 16a and 16b and the terminal portions 22b and 22c, thus obtaining a high-frequency signal transmission line 10, as shown in FIG. 1.

Figure 10:
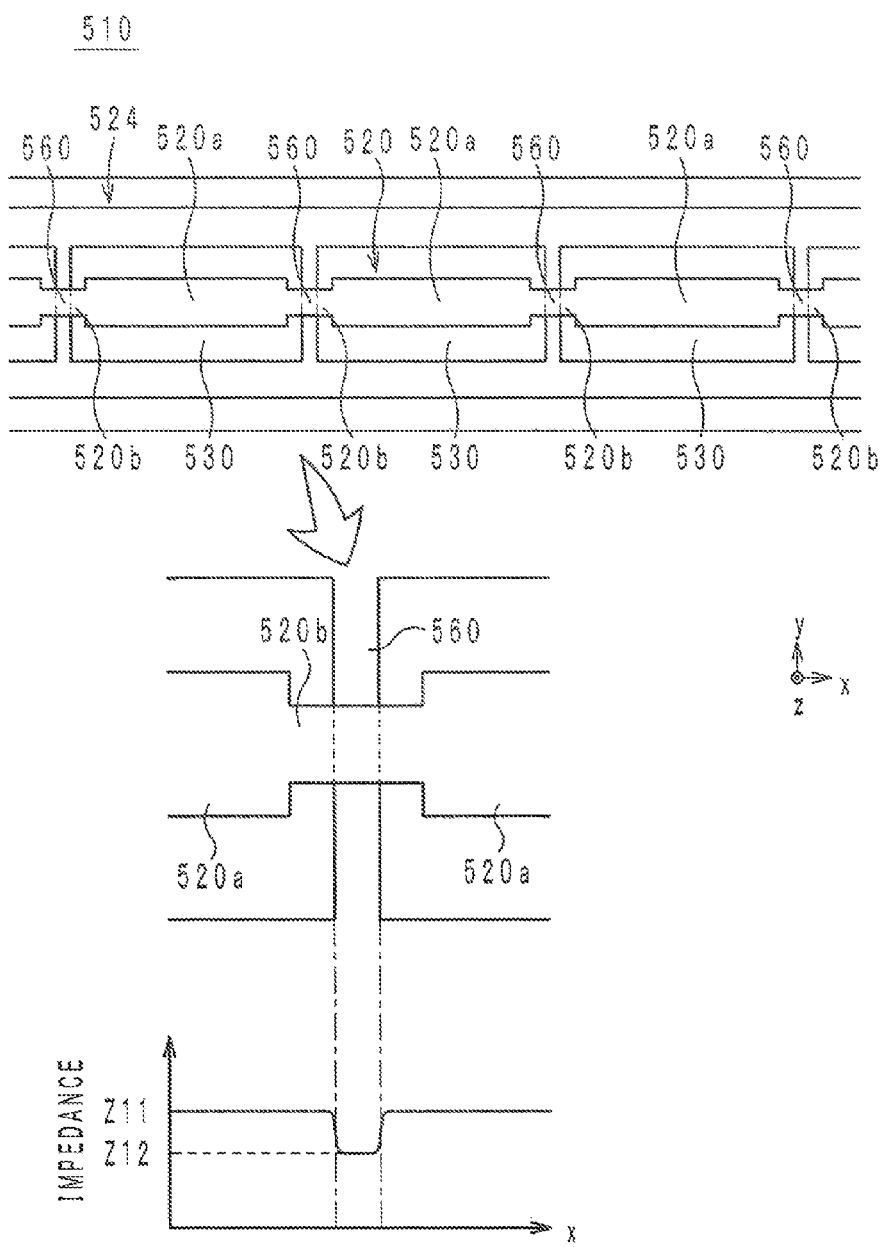
FIG. 10 provides a diagram illustrating a high-frequency signal transmission line according to a comparative example with a signal line and an auxiliary ground conductor overlapping with each other, and also provides a graph showing a change in characteristic impedance of the signal line.

The high-frequency signal transmission line 10 thus configured renders it possible to reduce insertion loss. FIG. 10 provides a diagram illustrating a high-frequency signal transmission line 510 according to a comparative example with a signal line 520 and an auxiliary ground conductor 524 overlapping with each other, and also provides a graph showing a change in characteristic impedance of the signal line 520. In the graph, the vertical axis represents the characteristic impedance, and the horizontal axis (x-axis) corresponds to the longitudinal direction of the high-frequency signal transmission line 510.

Note that the components of the high-frequency signal transmission line 510 that correspond to those of the high-frequency signal transmission line 10 are denoted by adding 500 to the reference numerals for the high-frequency signal transmission line 10.

The high-frequency signal transmission line 510 according to the comparative example differs from the high-frequency signal transmission line 10 in that bridge portions 560 cross thin portions 520b perpendicularly or substantially perpendicularly. Since the bridge portions 560 cross the thin portions 520b perpendicularly, the extent of overlapping between the signal line 520 and the bridge portion 560 in the y-axis direction changes sharply. Accordingly, capacitance generated between the signal line 520 and the bridge portion 560 also varies sharply. Therefore, the characteristic impedance of the signal line 520 changes abruptly between impedance values Z11 and Z12, as shown in FIG. 10. In the high-frequency signal transmission line 510 as above, high-frequency signal reflection occurs readily at the overlapping portions of the signal line 520 and the bridge portions 560.

Therefore, in the high-frequency signal transmission line 10, the bridge portions 60, when viewed in a plan view in the z-axis direction, cross the thin portions 20b obliquely. Accordingly, the extent of overlapping between the signal line 20 and the bridge portion 60 in the y-axis direction increases gradually and then decreases gradually, as shown in FIG. 3. As a result, capacitance generated between the signal line 20 and the bridge portion 60 also increases gradually and then decreases gradually. Therefore, the characteristic impedance of the signal line 20 changes gently between the impedance values Z1 and Z2, as shown in FIG. 3. In the high-frequency signal transmission line 10 as above, high-frequency signal reflection is less likely to occur at the overlapping portions of the signal line 20 and the bridge portions 60. Thus, the high-frequency signal transmission line 10 renders it possible to reduce insertion loss.

Further, in the high-frequency signal transmission line 10, high-frequency signal reflection in the thin portions 20b is significantly reduced or prevented by designing the characteristic impedance of the signal line 20 to fluctuate gently. Accordingly, in the case where high-frequency signal reflection in the thin portions 20b is reduced sufficiently or prevented, the width of the thin portion 20b may be increased. This reduces the resistance of the thin portion 20b, resulting in reduced insertion loss in the high-frequency signal transmission line 10. In addition, increasing the width of the thin portion 20b prevents the thin portion 20b from being broken.

Incidentally, in the case where the thin portion 20b has a width W1, the bridge portion 60 has a width W2, and the thin portion 20b and the bridge portion 60 form an angle θ, the following formula (1) is preferably satisfied, as will be described below.

$$\cos\theta > W2/W1 \ldots \quad (1)$$

Figure 11:
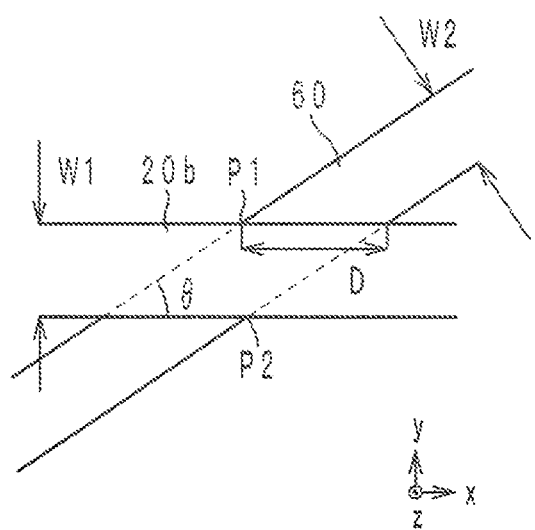
FIG. 11 is an enlarged view of a thin portion and a bridge portion in the high-frequency signal transmission line where $\cos \theta = W2/W1$.

FIG. 11 is an enlarged view of the thin portion 20b and the bridge portion 60 in the high-frequency signal transmission line 10 where $\cos\theta = W2/W1$. FIG. 11 shows an intersection P1 of the outer edge of the bridge portion 60 that is located on the positive side in the y-axis direction and the outer edge of the thin portion 20b that is located on the positive side in the y-axis direction, as well as an intersection P2 of the outer edge of the bridge portion 60 that is located on the negative side in the y-axis direction and the outer edge of the thin portion 20b that is located on the negative side in the y-axis direction, and the intersections P1 and P2 are aligned in the y-axis direction. Accordingly, the dimension of the overlap of the signal line 20 and the bridge portion 60 in the y-axis direction is maximized between the intersections P1 and P2 and is equal to the width W1. The dimension of the overlap of the signal line 20 and the bridge portion 60 in the y-axis direction decreases from the intersections P1 and P2 toward the positive end in the x-axis direction. In this case, the relationships represented by formulas (2) and (3) are satisfied.

$$\sin\theta = W2/D \ldots \quad (2)$$

$$\tan\theta = W1/D \ldots \quad (3)$$

By rearranging formulas (2) and (3), formula (4) can be obtained.

$$\cos\theta = W2/W1 \ldots \quad (4)$$

In this case, if the angle θ between the thin portion 20b and the bridge portion 60 shown in FIG. 11 is decreased, the maximum dimension of the overlap of the signal line 20 and the bridge portion 60 in the y-axis direction becomes less than the width W1. That is, by satisfying formula (1), the maximum dimension of the overlap of the signal line 20 and the bridge portion 60 in the y-axis direction is lowered. By decreasing the maximum dimension of the overlap of the signal line 20 and the bridge portion 60 in the y-axis direction in this manner, the capacitance generated between the thin portion 20b and the bridge portion 60 is reduced, so that the impedance value Z2 is set close to the impedance value Z1. Thus, the occurrence of high-frequency signal reflection at the overlapping portions of the signal line 20 and the bridge portions 60 is reduced or prevented more effectively.

Further, the high-frequency signal transmission line 10 renders it possible to prevent the bridge portions 60 from peeling off the dielectric sheet 18c. More specifically, when the high-frequency signal transmission line 510 shown in FIG. 10 is bent, the bridge portions 560 become parallel or substantially parallel to the bending line. In this case, if any bridge portion 560 is located along the bending line, the bridge portion 560 might peel off the dielectric sheet. On the other hand, in the high-frequency signal transmission line 10, the bridge portions 60 are oblique relative to the y-axis direction and therefore do not become parallel or substantially parallel to the bending line. Thus, even if any bridge portion 60 is located at the bending line, the bridge portion 60 is prevented from peeling off the dielectric sheet 18c.

Still further, in the high-frequency signal transmission line 10, the reference ground conductor 22 has no openings provided therein. This results in enhanced shielding effectiveness on the top-face side of the high-frequency signal transmission line 10. Accordingly, even if the top surface of the high-frequency signal transmission line 10 is attached to or placed near a metallic body such as the battery pack 206, capacitance is prevented from being created between the signal line 20 and the battery pack 206. Thus, the characteristic impedance of the high-frequency signal transmission line 10 is prevented from fluctuating significantly.

First Modification

Figure 12:
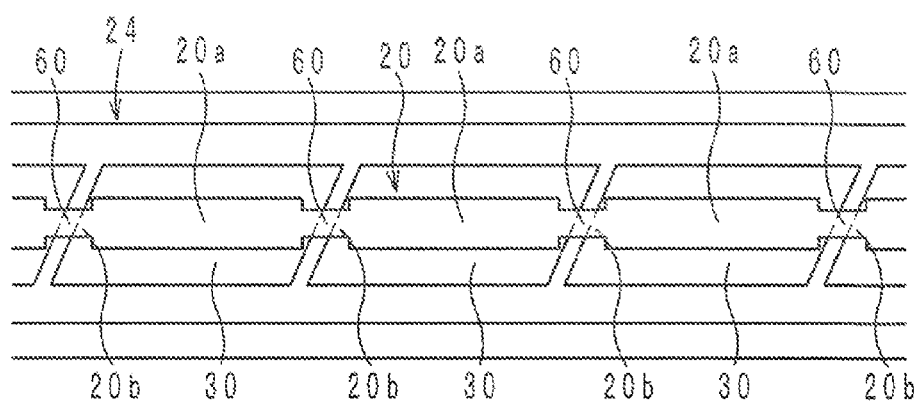
FIG. 12 is a view illustrating a high-frequency signal transmission line according to a first modification of a preferred embodiment of the present invention with a signal line and an auxiliary ground conductor overlapping with each other.
Figure 12:
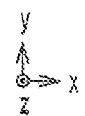

Hereinafter, a high-frequency signal transmission line 10a according to a first modification of a preferred embodiment of the present invention will be described with reference to the drawings. FIG. 12 is a view illustrating the high-frequency signal transmission line 10a with the signal line 20 and the auxiliary ground conductor 24 overlapping with each other. For the external oblique view of the high-frequency signal transmission line 10a, FIG. 1 will be referenced.

The high-frequency signal transmission line 10a differs from the high-frequency signal transmission line 10 in the shape of the bridge portion 60. More specifically, the bridge portion 60 of the high-frequency signal transmission line 10a preferably is in the form of a straight line which obliquely extends toward the positive end in the x-axis direction when viewed in the direction toward the positive end in the y-axis direction. Accordingly, the opening 30 preferably is in the shape of a parallelogram, for example.

As with the high-frequency signal transmission line 10, the high-frequency signal transmission line 10a also renders it possible to reduce insertion loss.

Second Modification

Figure 13:
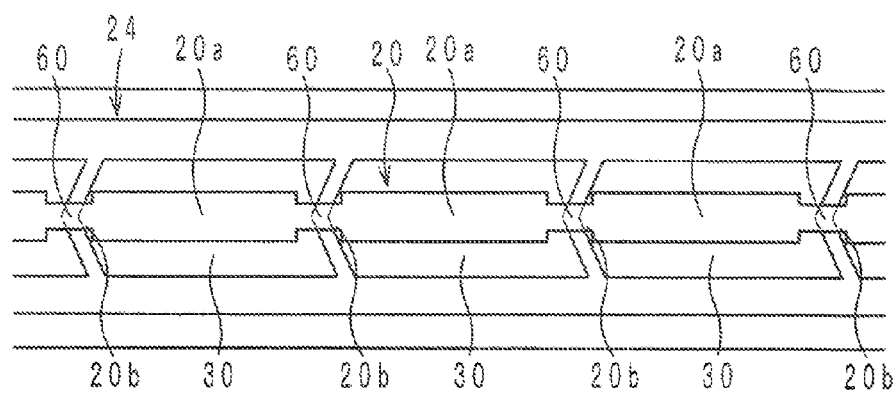
FIG. 13 is a view illustrating a high-frequency signal transmission line according to a second modification of a preferred embodiment of the present invention with a signal line and an auxiliary ground conductor overlapping with each other.
Figure 13:
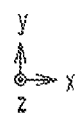

Hereinafter, a high-frequency signal transmission line 10b according to a second modification of a preferred embodiment of the present invention will be described with reference to the drawings. FIG. 13 is a view illustrating the high-frequency signal transmission line 10b with the signal line 20 and the auxiliary ground conductor 24 overlapping with each other. For the external oblique view of the high-frequency signal transmission line 10b, FIG. 1 will be referenced.

The high-frequency signal transmission line 10b differs from the high-frequency signal transmission line 10 in the shape of the bridge portion 60. More specifically, the bridge portion 60 of the high-frequency signal transmission line 10b preferably is in the shape of a V that has been rotated 90 degrees clockwise. That is, a half of the bridge portion 60 on the positive side in the y-axis direction obliquely extends toward the positive end in the x-axis direction when viewed in the direction toward the positive end in the y-axis direction. The other half of the bridge portion 60 on the negative side in the y-axis direction obliquely extends toward the positive end in the x-axis direction when viewed in the direction toward the negative end in the y-axis direction.

As with the high-frequency signal transmission line 10, the high-frequency signal transmission line 10b as above also renders it possible to reduce insertion loss.

Third Modification

Figure 14:
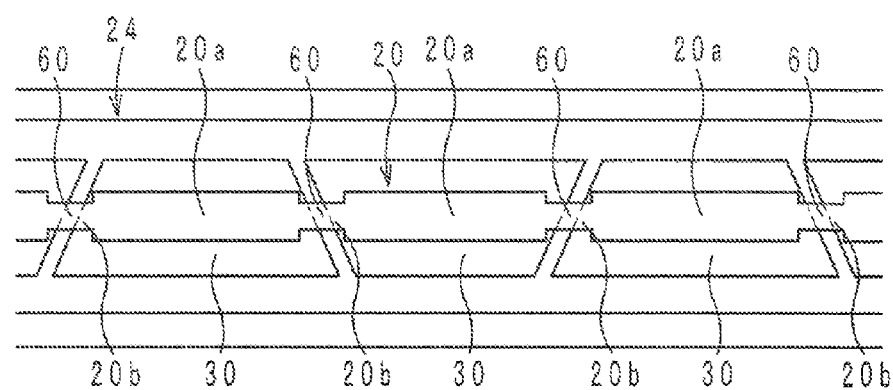
FIG. 14 is a view illustrating a high-frequency signal transmission line according to a third modification of a preferred embodiment of the present invention with a signal line and an auxiliary ground conductor overlapping with each other.

Hereinafter, a high-frequency signal transmission line 10c according to a third modification of a preferred embodiment of the present invention will be described with reference to the drawings. FIG. 14 is a view illustrating the high-frequency signal transmission line 10c with the signal line 20 and the auxiliary ground conductor 24 overlapping with each other. For the external oblique view of the high-frequency signal transmission line 10c, FIG. 1 will be referenced.

The high-frequency signal transmission line 10c differs from the high-frequency signal transmission line 10a in the shape of the bridge portion 60. More specifically, the high-frequency signal transmission line 10c includes two types of bridge portions 60 arranged so as to alternate with each other. One type of bridge portion 60 obliquely extends toward the positive end in the x-axis direction when viewed in the direction toward the positive end in the y-axis direction. The other type of bridge portion 60 obliquely extends toward the positive end in the x-axis direction when viewed in the direction toward the negative end in the y-axis direction. Accordingly, the opening 30 is preferably in the shape of a trapezoid, for example.

As with the high-frequency signal transmission line 10a, the high-frequency signal transmission line 10c as above also renders it possible to reduce insertion loss.

Fourth Modification

Figure 15:
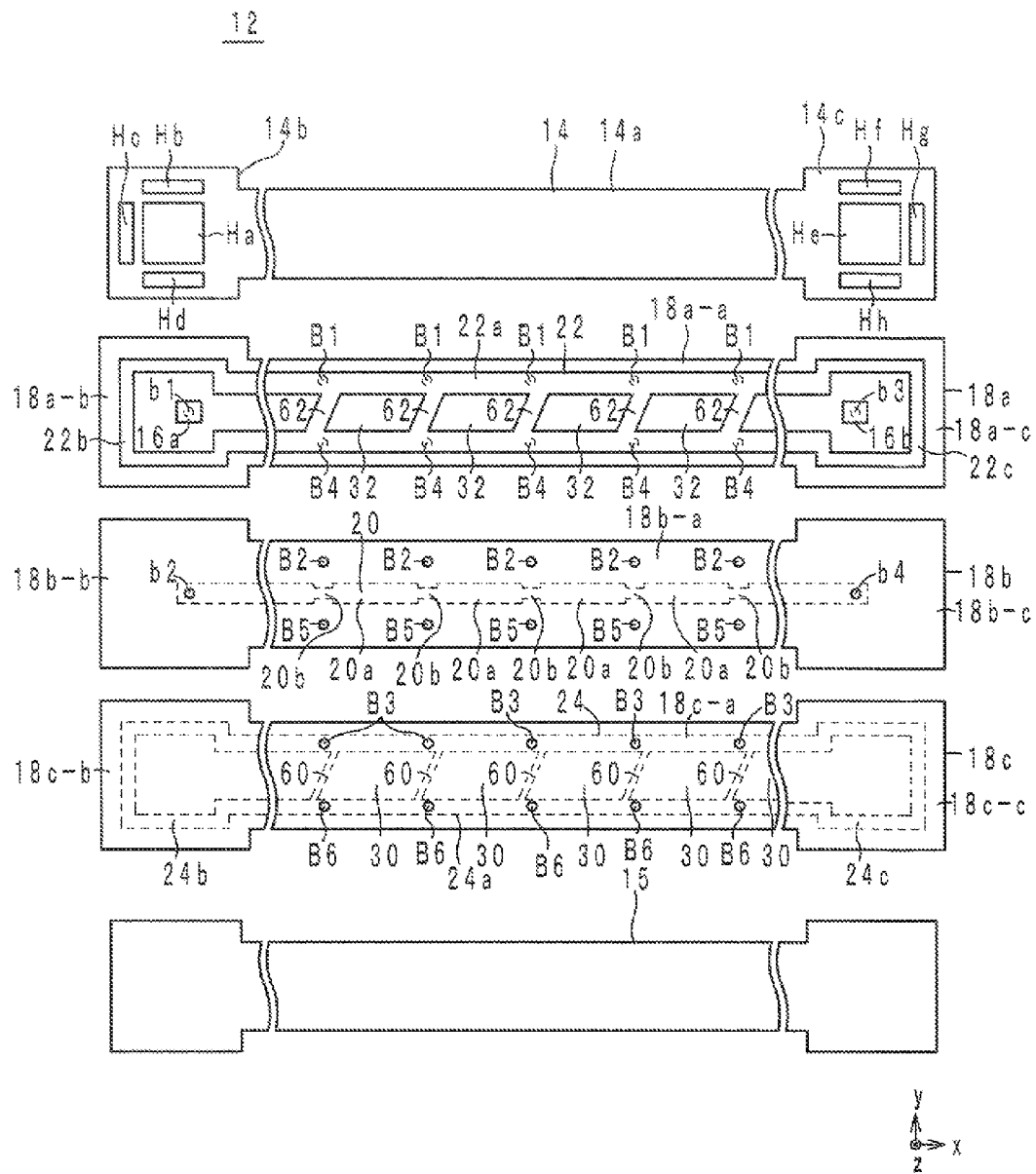
FIG. 15 is an exploded view of a dielectric element assembly of a high-frequency signal transmission line according to a fourth modification of a preferred embodiment of the present invention.
Figure 16:
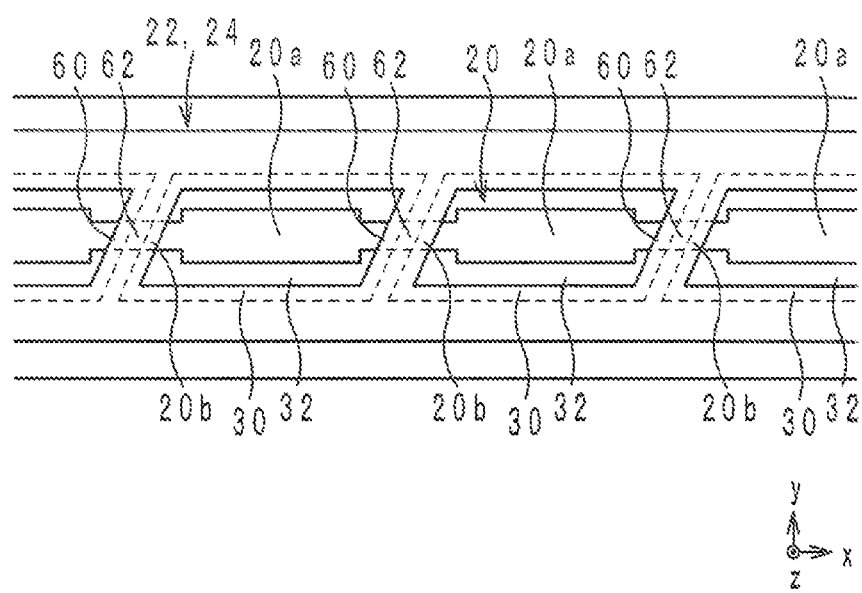
FIG. 16 is a view illustrating the high-frequency signal transmission line according to the fourth modification of a preferred embodiment of the present invention with a signal line and an auxiliary ground conductor overlapping with each other.

Hereinafter, a high-frequency signal transmission line 10d according to a fourth modification of a preferred embodiment of the present invention will be described with reference to the drawings. FIG. 15 is an exploded view of a dielectric element assembly 12 of the high-frequency signal transmission line 10d. FIG. 16 is a view illustrating the high-frequency signal transmission line 10d with the signal line 20 and the auxiliary ground conductor 24 overlapping with each other. For the external oblique view of the high-frequency signal transmission line 10d, FIG. 1 will be referenced.

The high-frequency signal transmission line 10d differs from the high-frequency signal transmission line 10a in that the reference ground conductor 22 includes openings 32 provided therein, as shown in FIG. 15. As with the opening 30, the opening 32 is preferably in the shape of a parallelogram, for example, as shown in FIGS. 15 and 16. In addition, the opening 32, when view in a plan view in the z-axis direction, is positioned within the boundaries of the opening 30. That is, the outer edge of the opening 30 does not overlap with the outer edge of the opening 32.

Further, the high-frequency signal transmission line 10d renders it possible to reduce insertion loss. More specifically, in the high-frequency signal transmission line 10d, once a current flows through the signal line 20, a feedback current (counter current) flows through the reference ground conductor 22, and a feedback current (counter current) flows through the auxiliary ground conductor 24 as well. In the high-frequency signal transmission line 10d, the outer edge of the opening 30 and the outer edge of the opening 32 do not overlap with each other when they are viewed in a plan view in the z-axis direction. Accordingly, the portion of the reference ground conductor 22 where the feedback current (counter current) flows and the portion of the auxiliary ground conductor 24 where the feedback current (counter current) flows are appropriately distant from each other. As a result, coupling between the feedback currents (counter currents) is weakened, so that the signal line 20 allows easy transmission of current, and therefore, insertion loss in the high-frequency signal transmission line 10d is reduced.

Still further, the reference ground conductor 22 preferably includes the openings 32 provided therein and also includes a plurality of bridge portions 62 provided between adjacent openings 32. The bridge portion 62 extends in the y-axis direction, and crosses the thin portion 20b when viewed in a plan view in the z-axis direction, as shown in FIGS. 15 and 16. The bridge portion 62 obliquely extends toward the positive end in the x-axis direction when viewed in the direction toward the positive end in the y-axis direction. Accordingly, the bridge portion 62, when viewed in a plan view in the z-axis direction, crosses the thin portion 20b obliquely.

As with the high-frequency signal transmission line 10a, the high-frequency signal transmission line 10d as above also renders it possible to reduce insertion loss.

Furthermore, in the high-frequency signal transmission line 10d, since the reference ground conductor 22 includes the openings 32 provided therein, less capacitance is generated between the signal line 20 and the reference ground conductor 22. Thus, it is possible to position the signal line 20 and the reference ground conductor 22 close to each other without causing the characteristic impedance of the signal line 20 to fluctuate significantly, whereby the high-frequency signal transmission line 10d is reduced in thickness.

Other Preferred Embodiments

The present invention is not limited to the high-frequency signal transmission lines 10 and 10a to 10d according to the above preferred embodiments, and changes are possible within the spirit and scope of the present invention.

Furthermore, the configurations of the high-frequency signal transmission lines 10 and 10a to 10d may be used in combination.

The protective layers 14 and 15 have been described above as being formed preferably by screen printing, but they may be formed by photolithography, for example.

The high-frequency signal transmission lines 10 and 10a to 10d do not necessarily have the connectors 100a and 100b mounted thereon. In such a case, the high-frequency signal transmission lines 10 and 10a to 10d are connected at their ends to circuit boards by solder or the like. Note that each of the high-frequency signal transmission lines 10 and 10a to 10d may have only the connector 100a mounted on one end.

Through-hole conductors may be used in place of the via-hole conductors. The through-hole conductors are inter-layer connecting portions, which are conductors formed, for example, by plating inner circumferential surfaces of through-holes provided in the dielectric element assembly 12.

The reference ground conductor 22 is not necessarily provided.

The high-frequency signal transmission lines 10 and 10a to 10d may be used on RF circuit boards such as antenna front end modules.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal transmission line, comprising:
a plate-shaped dielectric element assembly;
a signal line provided at the dielectric element assembly and including a plurality of thick portions and a plurality of thin portions with a smaller width than the thick portions; and
a first ground conductor provided at the dielectric element assembly and positioned on one side in a normal direction to the dielectric element assembly relative to the signal line, the first ground conductor including a plurality of openings overlapping with the signal line and also including bridge portions provided between the openings so as to cross the thin portions; wherein
the bridge portions cross the thin portion obliquely when viewed in a plan view in the normal direction to the dielectric element assembly.

2. The high-frequency signal transmission line according to claim 1, wherein the thick portions overlap with the openings.

3. The high-frequency signal transmission line according to claim 1, wherein the signal line is a linear signal line defined by a linear conductor.

4. The high-frequency signal line according to claim 1, wherein the plurality of openings is in a shape of one of a rectangle, a parallelogram, and a trapezoid.

5. The high-frequency signal transmission line according to claim 1, wherein the openings and the bridge portions overlap with the signal line alternatingly when seen in the plan view.

6. An electronic component comprising:
first and second high-frequency circuits; and
the high-frequency signal line according to claim 1; wherein
the first and second high-frequency circuits are connected to each other by the high-frequency signal line.

7. The electronic component according to claim 6, wherein the electric component is a cell phone.

8. The high-frequency signal transmission line according to claim 1, further comprising a second ground conductor provided at the dielectric element assembly on the other side in the normal direction relative to the signal line so as to overlap with the signal line.

9. The high-frequency signal transmission line according to claim 8, wherein the second ground conductor is provided with no openings overlapping with the signal line.

10. The high-frequency signal transmission line according to claim 8, wherein an overlap amount of the first ground conductor and the signal line is different from an overlap amount of the second ground conductor and the signal line.

11. An electronic device, comprising:
a high-frequency signal transmission line; and
a housing accommodating the high-frequency signal transmission line; wherein
the high-frequency signal transmission line includes:
a plate-shaped dielectric element assembly;
a linear signal line provided at the dielectric element assembly and including a plurality of thick portions and a plurality of thin portions with a smaller width than the thick portions; and
a first ground conductor provided at the dielectric element assembly and positioned on one side in a normal direction to the dielectric element assembly relative to the signal line, the first ground conductor including a plurality of openings overlapping with the signal line and also including bridge portions provided between the openings so as to cross the thin portions; and
the bridge portions cross the thin portion obliquely when viewed in a plan view in the normal direction to the dielectric element assembly.

12. The electronic device according to claim 11, wherein the thick portions overlap with the openings.

13. The electronic device according to claim 11, wherein the signal line is a linear signal line defined by a linear conductor.

14. The electronic device according to claim 11, wherein the plurality of openings is in a shape of one of a rectangle, a parallelogram, and a trapezoid.

15. The electronic device according to claim 11, wherein the openings and the bridge portions overlap with the signal line alternatingly when seen in the plan view.

16. The electronic device according to claim 11, further comprising a second ground conductor provided at the dielectric element assembly on the other side in the normal direction relative to the signal line so as to overlap with the signal line.

17. The electronic device according to claim 16, wherein the second ground conductor is provided with no openings overlapping with the signal line.

18. The electronic device according to claim 16, wherein an overlap amount of the first ground conductor and the signal line is different from an overlap amount of the second ground conductor and the signal line.

* * * * *